(12) United States Patent
Choi et al.

(10) Patent No.: US 8,022,398 B2
(45) Date of Patent: Sep. 20, 2011

(54) THIN FILM TRANSISTOR, METHOD OF FORMING THE SAME AND FLAT PANEL DISPLAY DEVICE HAVING THE SAME

(75) Inventors: Byoung deog Choi, Yongin-si (KR); Jun sin Yi, Seocho-gu (KR); Sung wook Jung, Suwon-si (KR); Kyung soo Jang, Seoul (KR); Jae hyun Cho, Gyeongsan-si (KR)

(73) Assignee: Sungkyunkwan University Foundation For Corporate Collaboration (KR)

( * ) Notice: Subject to any disclaimer, the term of this patent is extended or adjusted under 35 U.S.C. 154(b) by 99 days.

(21) Appl. No.: 12/388,829

(22) Filed: Feb. 19, 2009

(65) Prior Publication Data
US 2010/0148155 A1    Jun. 17, 2010

(30) Foreign Application Priority Data
Dec. 16, 2008    (KR) .......................... 10-2008-0127918

(51) Int. Cl.
*H01L 29/08*    (2006.01)
(52) U.S. Cl. .............. 257/40; 257/57; 257/66; 257/347; 438/151; 313/504
(58) Field of Classification Search .................... 257/40, 257/347, E21.361
See application file for complete search history.

(56) References Cited

U.S. PATENT DOCUMENTS

| 2006/0030084 A1* | 2/2006 | Young .......................... 438/149 |
| 2007/0159077 A1* | 7/2007 | Kim ............................. 313/504 |
| 2010/0264404 A1* | 10/2010 | Myung-Seok et al. ......... 257/40 |

* cited by examiner

*Primary Examiner* — Thanh V Pham
*Assistant Examiner* — Mark A Laurenzi
(74) *Attorney, Agent, or Firm* — Camoriano and Associates; Theresa Fritz Camoriano

(57) ABSTRACT

A thin film transistor (TFT), a method of forming the same and a flat panel display device having the same are disclosed. The TFT includes a buffer layer and a semiconductor layer which are sequentially disposed on a substrate, a gate pattern including an insulating pattern and a gate electrode pattern which are sequentially disposed on the semiconductor layer, source and drain regions defining a portion of the semiconductor layer below the gate pattern as a channel area, formed by doping the semiconductor layer disposed at both sides of the gate pattern with impurities, and extending from both sides of the channel area, a passivation layer which covers the entire surface of the substrate having the gate pattern, a first metal electrode which penetrates a portion of the passivation layer disposed on the source area and a portion of the source region below the portion of the passivation layer to be electrically connected with the source region, and a second metal electrode which penetrates a portion of the passivation layer disposed on the drain area and a portion of the drain region below the portion of the passivation layer to be electrically connected with the drain region. According to the present invention, a metal is infiltrated into source and drain regions to disperse an electric current when a TFT operates, and thus charge mobility is improved, and damage of a drain region caused by the excessive current density is prevented, leading to the long lifespan and excellent performance.

9 Claims, 5 Drawing Sheets

THIN FILM TRANSISTOR, METHOD OF FORMING THE SAME AND FLAT PANEL DISPLAY DEVICE HAVING THE SAME

CROSS-REFERENCE TO RELATED APPLICATION

This application claims priority to and the benefit of Korean Patent Application No. 10-2008-0127918, filed on Dec. 16, 2008, the disclosure of which is incorporated herein by reference in its entirety.

BACKGROUND

1. Field of the Invention

The present invention relates to a thin film transistor (TFT), a method of forming the same, and a flat panel display device having the same, and more particularly, to a TFT capable of dispersing an electric current by infiltrating a metal into source and drain regions when the TFT operates, whereby charge mobility is improved, and damage of a drain region caused by the excessive current density is prevented, leading to the long lifespan and excellent performance, a method of forming the same, and a flat panel display device having the same.

2. Discussion of Related Art

A thin film transistor (TFT), which is a type of a field effect transistor (FET), is commonly not only applied to a static random access memory (SRAM) or read only memory (ROM) but also used as a pixel switching element of an active matrix flat panel display device. For example, a TFT is used as a pixel switching element or a current driving element of a liquid crystal display (LCD) device or an organic electroluminescence display device. A TFT used as such a switching element serves to isolate individual pixels from electrical influence of neighboring pixels and to transmit an electrical signal to the pixels.

A semiconductor employed in a TFT is usually amorphous silicon (amorphous Si) or polycrystalline silicon (poly-Si). When current driving ability of a TFT or mobility of a charge carrier is considered, poly-Si is more suitable for a semiconductor used in a TFT. On the other hand, when a processing temperature or an available substrate is considered, amorphous Si is more suitable for a semiconductor used in a TFT, and thus semiconductors used in TFTs have mostly been formed of amorphous Si so far.

However, charge mobility in a TFT which uses amorphous Si is only about 0.5 cm$^2$/Vs. Therefore, in an LCD which uses a TFT having a channel formed of amorphous Si as a switching element, it is difficult to increase the operating speed. As a result, research on forming a channel of a TFT formed of a material having a higher charge mobility than amorphous Si or changing a structure of a TFT to increase charge mobility has been conducted.

FIG. 1 is a cross-sectional view illustrating a problem occurring in a conventional TFT.

As shown in FIG. 1, the conventional TFT includes a buffer layer 2 disposed on a substrate 1. A semiconductor pattern 3 is disposed on the buffer layer 2, and an insulating layer 4 and a gate electrode 5 are disposed sequentially on the semiconductor pattern 3. The semiconductor pattern 3 below the gate electrode 5 functions as a channel area. A source region 6 and a drain region 7 are disposed in parallel to the semiconductor pattern 3.

If the TFT is used as a driving element of an LCD as described above, the TFT has a charge moving path CP1 which is wider in a direction of the drain region 7 from the channel region 3. Charges are concentrated in a local area A while moving to the drain region 7, and thus the extent to which charges are dispersed is increased in the local area A. As a result, there occurs a problem in that the charge mobility is decreased. Also, the charge moving path CP1 becomes almost perpendicular in the drain region 7, and thus stress is continuously applied to the local area A. Consequently, as a time goes by, driving characteristics of the TFT deteriorate, leading to a short lifespan.

SUMMARY OF THE INVENTION

The present invention is directed to a TFT capable of dispersing an electric current by infiltrating a metal into source and drain regions when the TFT operates, thereby improving charge mobility, a method of forming the same, and a flat panel display device having the same.

The present invention is also directed to a TFT in which damage of the drain region caused by the excessive current density is prevented while the TFT is operating, thereby increasing the lifespan and improving performance, a method of forming the same, and a flat panel display device having the same.

According to an aspect of the present invention, a method of forming a thin film transistor (TFT) includes: sequentially forming a buffer layer, a preliminary channel area, an insulating layer, and a gate electrode layer on a substrate; sequentially patterning the gate electrode layer and the insulating layer to expose a portion of the preliminary channel area, and forming a gate pattern; doping the exposed portion of the preliminary channel area with impurities using the gate pattern as a mask to define a channel area and form source and drain regions; forming a passivation layer over the entire surface of the substrate having the source and drain regions; etching portions of the passivation layer formed on the source and drain regions to form first and second contact holes which expose portions of the buffer layer; and forming a metal electrode layer over the entire surface of the substrate to fill the first and second contact holes.

The forming the first and second contact holes may include: forming a photoresist pattern on the passivation layer to expose portions of the passivation layer formed on the source and drain regions; performing an etching process on the substrate having the photoresist pattern to etch the exposed portions of the passivation layer, and exposing portions of the source and drain regions; etching the exposed portions of the source and drain regions to expose portions of the buffer layers; and removing the photoresist pattern.

The method may further include, after forming the metal electrode layer, etching the metal electrode layer formed on the passivation layer between the first contact hole and the second contact hole to expose the passivation layer.

According to another aspect of the present invention, a method of forming a thin film transistor (TFT) includes: sequentially forming a buffer layer, a preliminary channel area, an insulating layer, and a gate electrode layer on a substrate; sequentially patterning the gate electrode layer and the insulating layer to expose a portion of the preliminary channel area, and forming a gate pattern; doping the exposed portion of the preliminary channel area with impurities using the gate pattern as a mask to define a channel area and form source and drain regions; forming a passivation layer over the entire surface of the substrate having the source and drain regions; etching portions of the passivation layer formed on the source and drain regions and the gate pattern to form a first contact hole, a second contact hole and a third contact hole which expose portions of the buffer layer; and forming a metal electrode layer over the entire surface of the substrate to fill the first contact hole, the second contact hole and the third contact hole.

The forming the first contact hole, the second contact hole and the third contact hole may include: forming a first photoresist pattern on the passivation layer to expose portions of the passivation layer formed on the source and drain regions and the gate pattern; performing an etching process on the substrate having the first photoresist pattern to etch the exposed portions of the passivation layer, exposing portions of the source and drain regions and a portion of the gate pattern, and forming a first preliminary contact hole, a second preliminary contact hole and a third contact hole; removing the first photoresist pattern; forming a second photoresist pattern which exposes the first preliminary contact hole and the second preliminary contact hole on the substrate having the first preliminary contact hole, the second preliminary contact hole and the third contact hole; performing an etching process on the substrate having the second photoresist pattern to form a first contact hole and a second contact hole which respectively penetrate the exposed portions of the source and drain regions to expose portions of the buffer layer; and removing the second photoresist pattern.

The method may further include, after forming the metal electrode layer, etching the metal electrode layer formed on the passivation layer between the first contact hole and the third contact hole and the metal electrode layer formed on the passivation layer between the third contact hole and the second contact hole to expose the passivation layer.

The source and drain regions may be formed to a thickness of about 10 nm to 50 nm, respectively.

The channel area may be formed of amorphous silicon, nano-crystalline silicon, micro-crystalline silicon, a group 3-5 semiconductor, a group 2-6 semiconductor, or poly-crystalline silicon.

The metal electrode layer may be formed of a material which includes aluminum or an aluminum alloy.

According to still another aspect of the present invention, a thin film transistor (TFT) includes: a buffer layer and a semiconductor layer which are sequentially disposed on a substrate; a gate pattern including an insulating pattern and a gate electrode pattern which are sequentially disposed on the semiconductor layer; source and drain regions defining a portion of the semiconductor layer below the gate pattern as a channel area, formed by doping the semiconductor layer disposed at both sides of the gate pattern with impurities, and extending from both sides of the channel area; a passivation layer which covers the entire surface of the substrate having the gate pattern; a first metal electrode which penetrates a portion of the passivation layer disposed on the source area and a portion of the source region below the portion of the passivation layer to be electrically connected with the source region; and a second metal electrode which penetrates a portion of the passivation layer disposed on the drain area and a portion of the drain region below the portion of the passivation layer to be electrically connected with the drain region.

The TFT may further include a third metal electrode which penetrates a portion of the passivation layer on the gate electrode pattern to be electrically connected with the gate electrode.

The first and second metal electrodes may be formed of aluminum or an aluminum alloy.

The channel area may be formed of amorphous silicon, nano-crystalline silicon, micro-crystalline silicon, a group 3-5 semiconductor, a group 2-6 semiconductor, or poly-crystalline silicon.

The source and drain regions may be formed to a thickness of about 10 nm to 50 nm, respectively.

According to yet another aspect of the present invention, a flat panel display device includes: a buffer layer and a semiconductor layer which are sequentially disposed on a substrate; a gate pattern including an insulating pattern and a gate electrode pattern which are sequentially disposed on the semiconductor layer; source and drain regions defining a portion of the semiconductor layer below the gate pattern as a channel area, formed by doping the semiconductor layer disposed at both sides of the gate pattern with impurities, and extending from both sides of the channel area; a passivation layer which covers the entire surface of the substrate having the gate pattern; a first metal electrode which penetrates a portion of the passivation layer disposed on the source area and a portion of the source region below the portion of the passivation layer to be electrically connected with the source region; a second metal electrode which penetrates a portion of the passivation layer disposed on the drain area and a portion of the drain region below the portion of the passivation layer to be electrically connected with the drain region; a passivation insulating layer which covers the substrate having the second metal electrode; and an organic light-emitting diode disposed on the substrate having the passivation insulating layer to be electrically connected with the drain region.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Hereinafter, a method of forming a TFT according to an exemplary embodiment of the present invention will be described in detail with reference to FIGS. 2A to 2H. FIGS. 2A to 2H are cross-sectional views illustrating a method of forming a TFT according to an exemplary embodiment of the present invention.

Figure 2A:
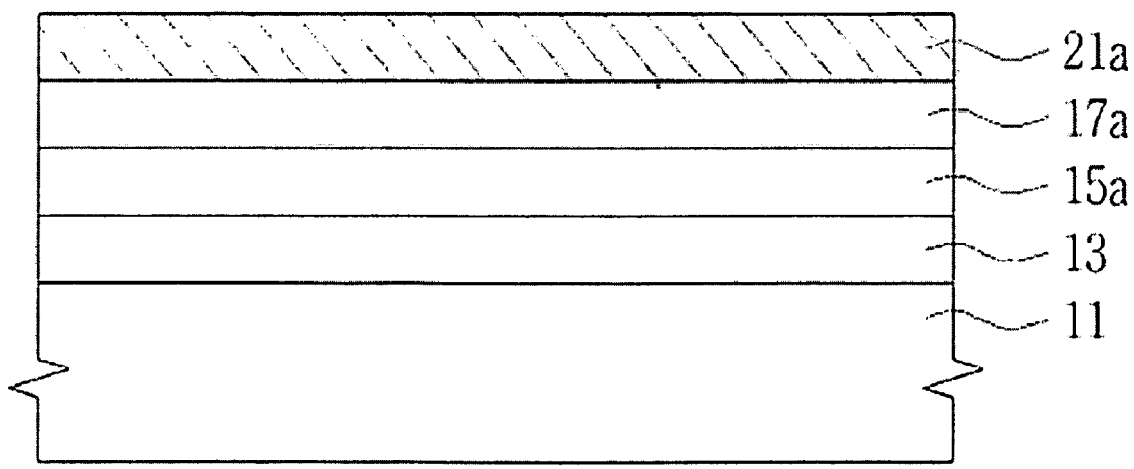
FIGS. 2A to 2H are cross-sectional views illustrating a method of forming a TFT according to an exemplary embodiment of the present invention.

As shown in FIG. 2A, the TFT according to an exemplary embodiment of the present invention includes a buffer layer 13 formed on a glass substrate 11. The buffer layer 13 may be formed of a single layer of a silicon nitride (SiNx) layer or a silicon oxide (SiOx) layer or multi layers thereof. In the exemplary embodiment of the present invention, the buffer layer 13 preferably has a double-layer structure in which a silicon nitride layer and a silicon oxide layer are sequentially stacked on the glass substrate 11 in consideration of thermal expansion or an interface state with any other layer. In this instance, the silicon nitride layer may be formed to a thickness of 200 nm, and the silicon oxide layer may be formed to a thickness of 100 nm.

A preliminary channel area 15a which is used to form a path through which electrons or holes move is formed on the buffer layer 13. The preliminary channel area 15a may be formed of any one selected from an amorphous silicon thin layer, a nano-crystalline silicon thin layer, a micro-crystalline silicon thin layer, a poly-crystalline silicon thin layer, a group 3-5 semiconductor thin layer, a group 2-6 semiconductor thin layer, and an oxide semiconductor thin layer. If the preliminary channel area 15a is formed of an amorphous silicon thin layer, the preliminary channel area 15a may be crystallized by an excimer laser crystallization technique, a solid phase crystallization technique or a metal induced crystallization technique.

An insulating layer 17a and a gate electrode layer 21a are sequentially formed on the preliminary channel area 15a. The insulating layer 17a may be formed of a single layer of a silicon oxide layer or a silicon nitride layer or multiple layers thereof. The gate electrode layer 21a may be formed of a metal-based material or a semiconductor-based material. For example, the gate electrode layer 21a may be formed of a material selected from aluminum (Al), chromium (Cr), silver (Ag), and gold (Au) or may be formed by crystallizing amorphous silicon by a method of irradiating a laser beam.

Figure 2B:
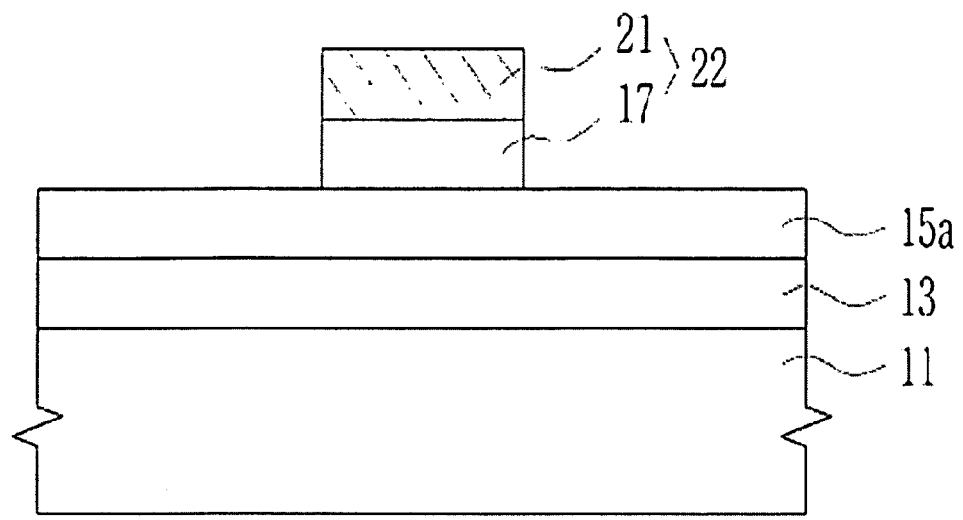
Figure 2C:
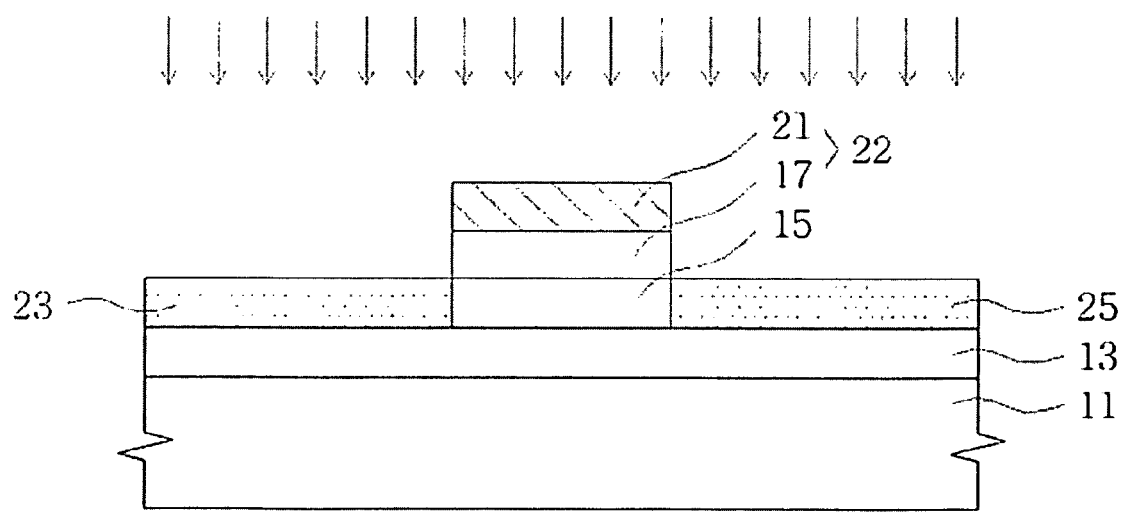
Figure 2D:
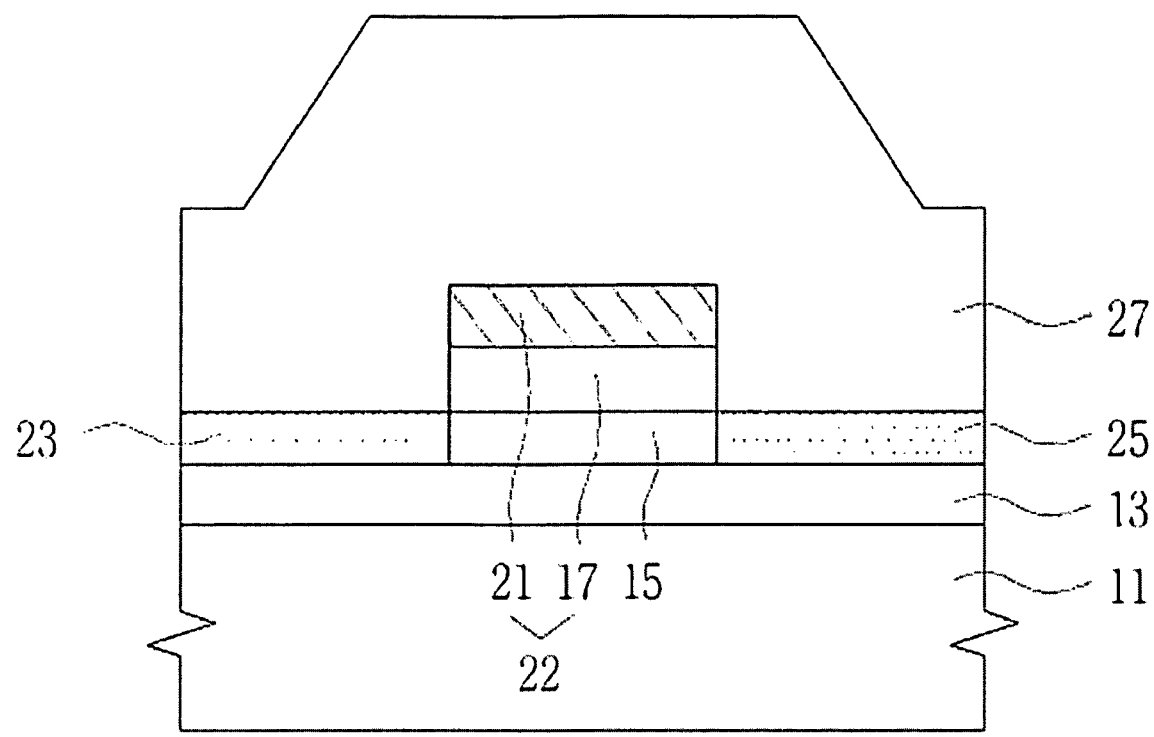

As shown in FIGS. 2B to 2D, the gate electrode layer 21a and the insulating layer 17a are sequentially patterned to expose a top surface of the preliminary channel area 15a, thereby forming a gate electrode pattern 21 and an insulating pattern 17. Here, the gate electrode pattern 21 and the insulating pattern 17 form a gate pattern 22. In this instance, the insulating pattern 17 may be formed of a single layer of a silicon oxide layer or a silicon nitride layer or multiple layers thereof.

Then, an ion implantation process is performed by doping the substrate 11 having the preliminary channel area 15a with impurity ions using the gate pattern 22 as a mask. As a result, portions of the preliminary channel area 15a which are separated by the gate pattern 22 are formed as a source region 23 and a drain region 25. Also, a portion of the preliminary channel area 15a below the gate pattern 22 is defined as a channel area 15. Preferably, the source and drain regions 23 and 25 are formed to a thickness of about 10 nm to 50 nm, respectively. A passivation layer 27 is formed over the entire surface of the substrate 11 having the source and drain regions 23 and 25. The passivation layer 27 may be formed of a silicon nitride layer or a silicon oxide layer.

Figure 2E:
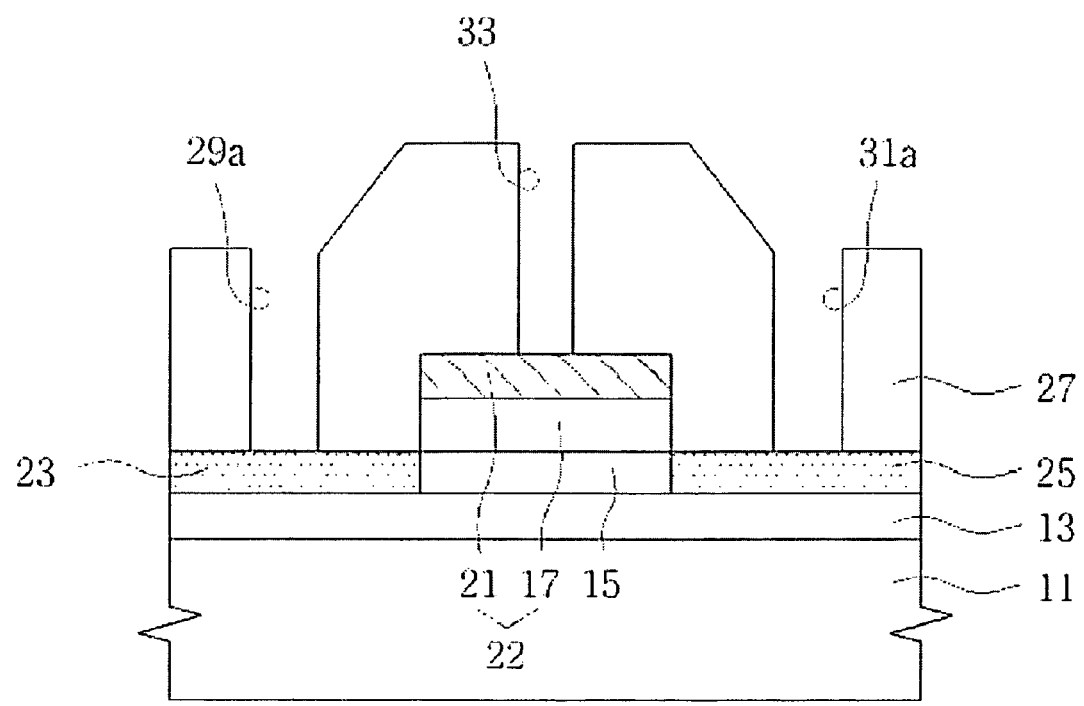
Figure 2F:
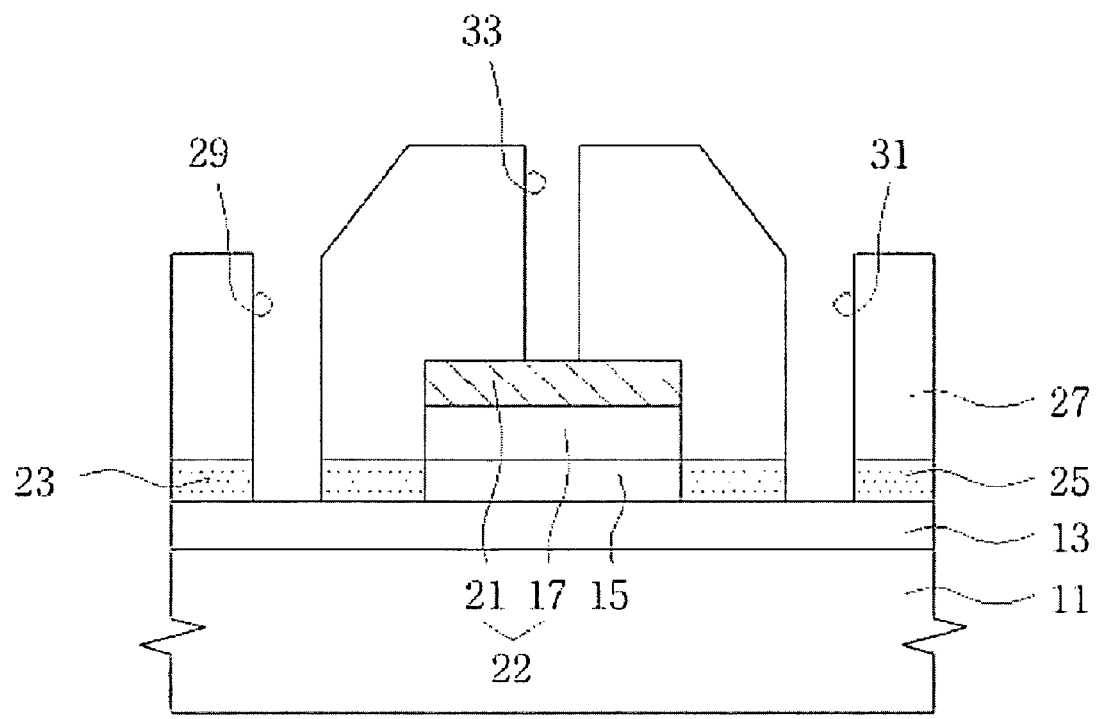

As shown in FIGS. 2E and 2F, a first photoresist pattern (not shown) is formed on the passivation layer 27 to expose portions of the passivation layer 27 over the source and drain regions 23 and 25. The substrate 11 having the first photoresist pattern is subjected to an anisotropic etching process, such that the passivation layer 27 is penetrated to form a first preliminary contact hole 29a which exposes a portion of the source region 23 and a second preliminary contact hole 31a which exposes a portion of the drain region 25. In this instance, a third contact hole 33 which penetrates a portion of the passivation layer 27 formed on the gate pattern 22 may be formed to expose a portion of the gate electrode pattern 21.

Next, the first photoresist pattern is removed, and a second photoresist pattern (not shown) is formed over the entire surface of the substrate 11 having the second preliminary contact hole 31a to expose the first preliminary contact hole 29a and the second preliminary contact hole 31a. The substrate 11 having the second photoresist pattern is subjected to an anisotropic etching process to form a first contact hole 29 which penetrates the source region 23 below the first preliminary contact hole 29a to expose a portion of the buffer layer 13. At this time, while the first contact hole 29 is formed, a second contact hole 31 which penetrates the drain region 25 below the second preliminary contact hole 31a is formed to expose a portion of the buffer layer 13. Then, the second photoresist pattern is removed.

Figure 2G:
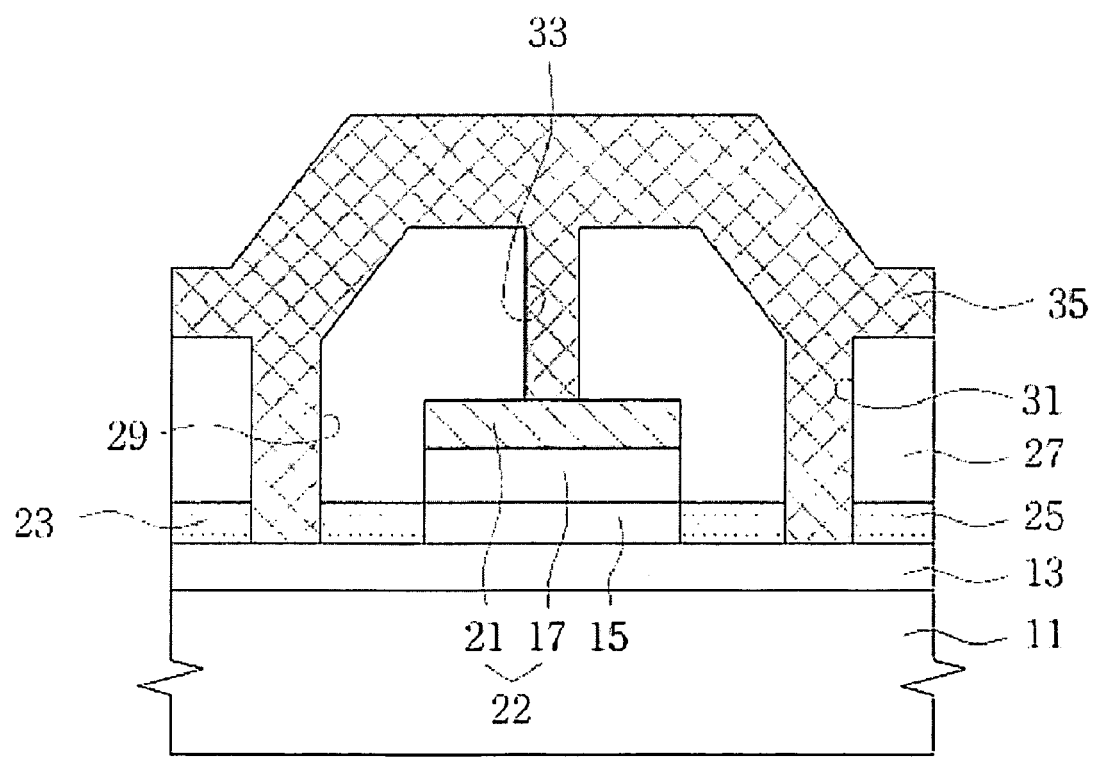
Figure 2H:
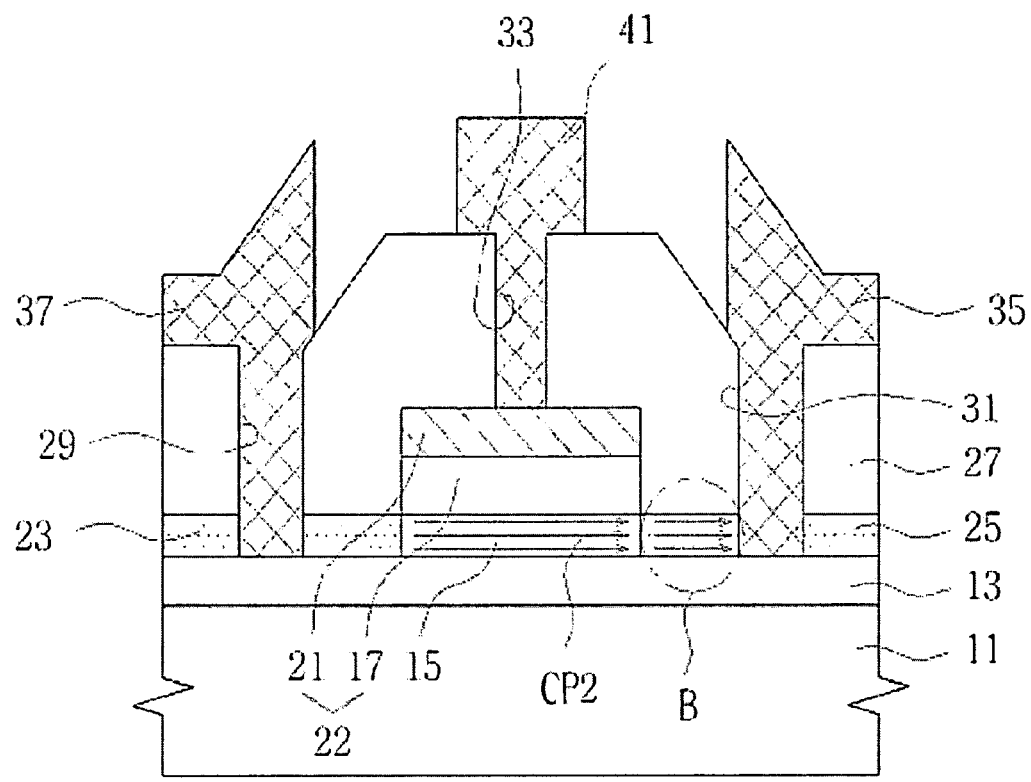

As shown in FIGS. 2G and 2H, a metal electrode layer 35 is formed over the entire surface of the substrate 11 having the first to third contact holes 29, 31 and 33 to fill the first to third contact holes 29, 31 and 33. The metal electrode layer 35 may be formed of aluminum (Al) or an aluminum alloy. After forming the metal electrode layer 35, a portion of the metal electrode layer 35 disposed over the passivation layer 27 between the first and third contact holes 29 and 33 is etched to form a first metal electrode 37 which is electrically connected with the source region 23. Also, a portion of the metal electrode layer 35 disposed over the passivation layer 27 between the third and second contact holes 33 and 31 is etched to form a second metal electrode 39 which is electrically connected with the drain region 25 and a third metal electrode 41 which is electrically connected with the gate electrode pattern 21.

Figure 1:
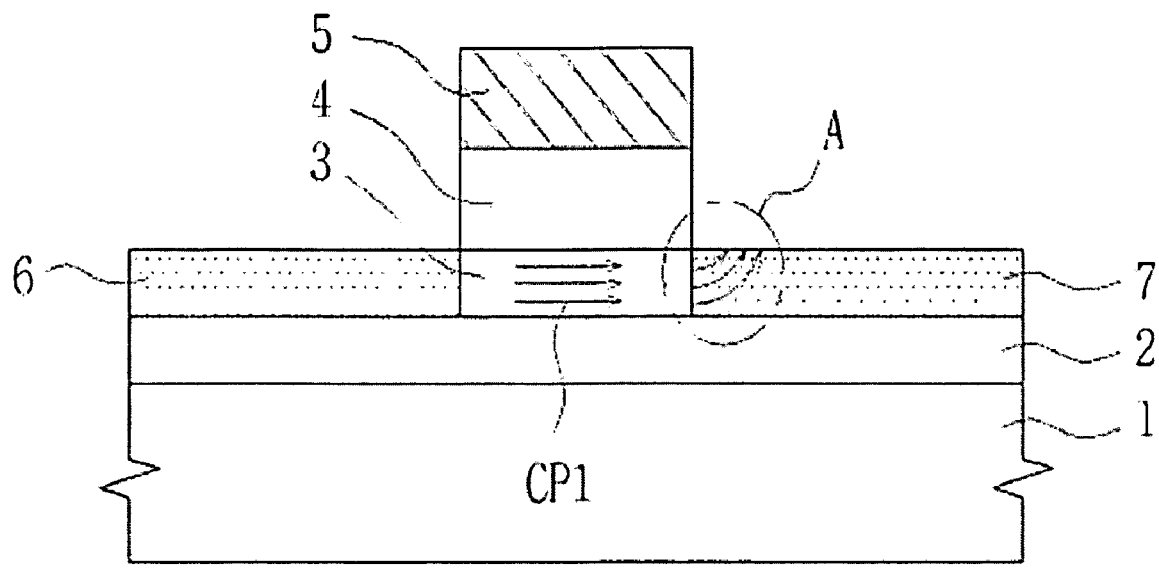
FIG. 1 is a cross-sectional view illustrating a problem occurring in a conventional TFT.

Therefore, when the TFT according to an exemplary embodiment of the present invention is used as a driving element of a flat panel display device, an electric current CP2 flowing through the channel area 15 is dispersed in the drain region B, so that stress which is applied to the location area A of the conventional TFT of FIG. 1 is decreased, leading to the relatively long lifespan compared to the conventional TFT of FIG. 1. Also, the TFT according to an exemplary embodiment of the present invention has an improved charge moving characteristic since an electric current flowing in the drain region is wide.

Next, the TFT according to an exemplary embodiment of the present invention will be described with reference to FIG. 2H.

As shown in FIG. 2H, the TFT according to an exemplary embodiment of the present invention includes a buffer layer 13 and a semiconductor layer 15a which are sequentially disposed on a substrate 11. The buffer layer 13 may be formed of a single layer of a silicon nitride (SiNx) layer or a silicon oxide (SiOx) layer or multi layers thereof. For example, the buffer layer 13 has preferably a double-layer structure in which a silicon nitride layer and a silicon oxide layer are sequentially stacked on the glass substrate 11 in consideration of thermal expansion in a non-volatile memory device or an interface state with any other layer. In this instance, preferably, the silicon nitride layer is formed to a thickness of 200 nm, and the silicon oxide layer is formed to a thickness of 100 nm.

A gate pattern 22 including an insulating pattern 17 and a gate electrode pattern 21 which are sequentially stacked on the semiconductor layer 15a is disposed. The insulating pattern 17 may be formed of a single layer of a silicon oxide layer or a silicon nitride layer or multiple layers thereof. A portion of the semiconductor layer 15a below the gate pattern 22 is defined as the channel area 15, and source and drain regions 23 and 25 are formed by doping the semiconductor layer 15a disposed at both sides of the gate pattern 22 with impurities, and connected to both sides of the channel area 15. Preferably, the source and drain regions 23 and 25 have a thickness of about 10 nm to 50 nm. The channel area 15 has the same width as the gate pattern 22. The channel area 15 may be formed of any one selected from amorphous silicon, nano-crystalline silicon, micro-crystalline silicon, a group 3-5 semiconductor, a group 2-6 semiconductor, and poly-crystalline silicon.

A passivation layer 27 is formed to cover the entire surface of the substrate 11 having the gate pattern 22. A first metal electrode 37 is disposed to penetrate a portion of the passivation layer 27 disposed on the source region 23 and a portion of the source region 23 below the portion of the passivation layer 27 to be electrically connected with the source region 23. Also, a second metal electrode 39 is disposed to penetrate a portion of the passivation layer 27 disposed on the drain region 25 and a portion of the drain region 25 below the portion of the passivation layer 27 to be electrically connected with the drain region 25. In this instance, a third metal electrode 41 may be disposed to penetrate a portion or the passivation layer 27 disposed on the gate electrode pattern 22 to be electrically connected with the gate electrode pattern 21. Each of the first to third metal electrodes 37, 39 and 41 may be formed of a material which contains aluminum (Al) or an aluminum alloy.

Figure 3:
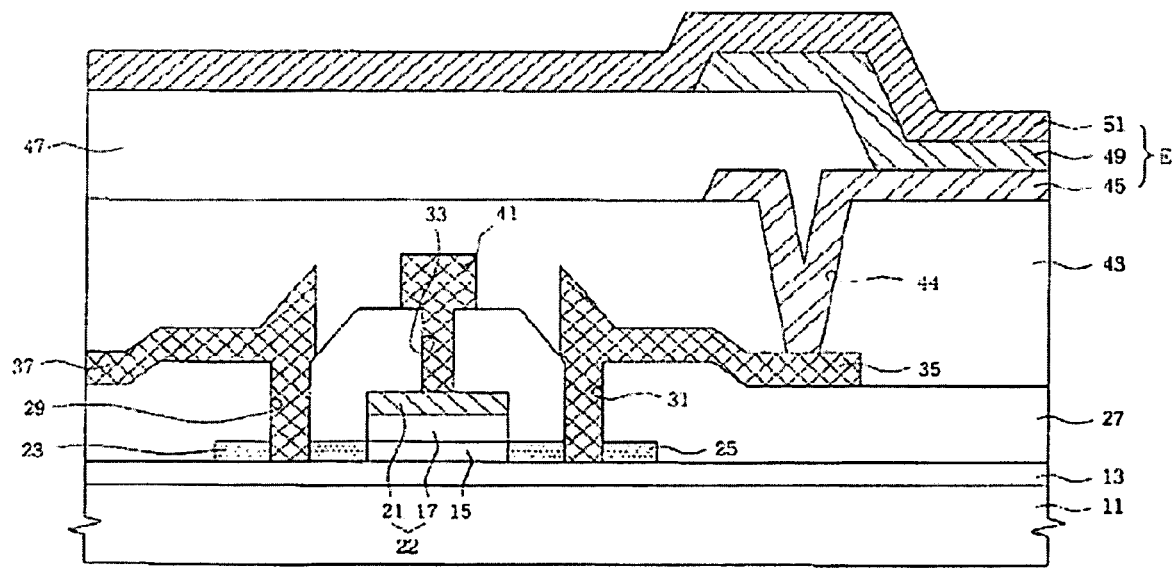
FIG. 3 is a cross-sectional view of a flat panel display device having a TFT according to an exemplary embodiment of the present invention.

Next, a flat panel display device which employs the TFT according to an exemplary embodiment of the present invention will be described with reference to FIGS. 2H and 3. FIG. 3 is a cross-sectional view of a flat panel display device which includes the TFT according to an exemplary embodiment of the present invention.

As shown in FIGS. 2H and 3, the flat panel display device includes a passivation insulating layer 43 which covers the TFT. The passivation insulating layer 43 may be formed of an inorganic insulating layer or an organic insulating layer. For example, as the inorganic insulating layer, a silicon oxide layer, a silicon nitride layer, or a stacked layer thereof may be formed. Also, the organic insulating layer may be formed of polyamide resin, polyimide resin, or acrylic-based resin. A first electrode 45 is disposed on the passivation insulating layer 43 to expose a portion of the passivation insulating layer 43.

The first electrode 45 is electrically connected with the drain region 25 of the TFT by filling a via hole 44 which penetrates the passivation insulating layer 43. The first electrode 45 may be patterned and disposed for each pixel of the flat panel display device. The first electrode 45 may be formed of a light transmitting conductive layer, a light reflecting conductive layer, or a double layer thereof. For example, the light transmitting conductive layer may be formed of indium tin oxide (ITO), indium zinc oxide (IZO), or a gallium (Ga)-based compound. Also, the light reflecting conductive layer may be formed of platinum (Pt), gold (Au), iridium (Ir), chromium (Cr), magnesium (Mg), silver (Ag), nickel (Ni), aluminum (Al), or an alloy thereof.

A pixel isolation layer pattern 47 is disposed on the exposed portion of the passivation insulating layer 43 and a portion of the first electrode 45 filling the via hole 44 to define a pixel of the flat panel display device. Therefore, when seen from a top surface, the pixel isolation layer pattern 47 has a lattice-shaped opening which exposes the first electrode 45. That is, the pixel isolation layer pattern 47 is disposed over the substrate 11 to cover the edge of the first electrode 45.

An organic light-emitting layer 49 is disposed on the edge of the pixel isolation layer pattern 47 and the exposed portion of the first electrode 45. A second electrode 51 is disposed to cover the pixel isolation layer pattern 47 and the organic light-emitting layer 49. The second electrode 51 may be formed of a material selected from the group composed of magnesium (Mg), calcium (Ca), aluminum (Al), and an alloy thereof. The organic light-emitting layer 49 generates light such that a first charge provided from the first electrode 45 and a second charge provided from the second electrode 51 are recombined to form an image. In this instance, the pixel isolation layer pattern 47 prevents a short circuit from occurring between the edge of the first electrode 45 and the second electrode 51 which is relatively high in charge density, thereby preventing the organic light-emitting layer 49 from deteriorating. Accordingly, the first electrode 45, the organic light-emitting layer 49 and the second electrode 51 form an organic light emitting diode E which is electrically connected with the TFT.

Heretofore, the exemplary embodiment of the present invention has been described centering on the method of manufacturing a semiconductor device, but the present invention is not limited thereto and may be variously modified such as a method of manufacturing a nano device using a nano structure having a self-assembly characteristic without departing from the spirit or scope of the present invention.

In the drawings, the thickness of layers and regions are exaggerated for clarity. Also, when an element or layer is referred to as being "on" another element or layer, it can be directly on the other element or layer, or intervening elements or layers may be present.

The present invention relates to a TFT, a method of forming the same and a flat panel display device having the same. The present invention can be widely applied in a display industry.

As described above, in a TFT, a method of forming the same, and a flat panel display device having the same according to the exemplary embodiment of the present invention, a metal is infiltrated into source and drain regions to disperse an electric current when the TFT operates, thereby improving charge mobility, Further, in the TFT, the method of forming the same, and the flat panel display device having the same according to the exemplary embodiment of the present invention, damage of the drain region caused by the excessive current density is prevented while the TFT operates, thereby increasing the lifespan and improving the performance.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:
1. A thin film transistor (TFT), comprising:
a buffer layer and a semiconductor layer which are sequentially disposed on a substrate;
a gate pattern including an insulating pattern and a gate electrode pattern which are sequentially disposed on the semiconductor layer;
source and drain regions defining a portion of the semiconductor layer below the gate pattern as a channel area, formed by doping the semiconductor layer disposed at both sides of the gate pattern with impurities, and extending from both sides of the channel area;
a passivation layer which covers the entire surface of the substrate having the gate pattern;
a first metal electrode which penetrates a portion of the passivation layer disposed on the source area and a portion of the source region below the portion of the passivation layer to contact an exposed portion of the buffer layer and be electrically connected with the source region; and
a second metal electrode which penetrates a portion of the passivation layer disposed on the drain area and a portion of the drain region below the portion of the passivation layer to contact an exposed portion of the buffer layer and be electrically connected with the drain region.

2. The TFT of claim 1, further comprising, a third metal electrode which penetrates a portion of the passivation layer on the gate electrode pattern to be electrically connected with the gate electrode.

3. The TFT of claim 1, wherein the first and second metal electrodes are formed of aluminum or an aluminum alloy.

4. The TFT of claim 1, wherein the channel area is formed of amorphous silicon, nano-crystalline silicon, micro-crystalline silicon, a group 3-5 semiconductor, a group 2-6 semiconductor, or poly-crystalline silicon.

5. The TFT of claim 1, wherein the source and drain regions are formed to a thickness of about 10 nm to 50 nm, respectively.

6. A flat panel display device, comprising:
   a buffer layer and a semiconductor layer which are sequentially disposed on a substrate;
   a gate pattern including an insulating pattern and a gate electrode pattern which are sequentially disposed on the semiconductor layer;
   source and drain regions defining a portion of the semiconductor layer below the gate pattern as a channel area, formed by doping the semiconductor layer disposed at both sides of the gate pattern with impurities, and extending from both sides of the channel area;
   a passivation layer which covers the entire surface of the substrate having the gate pattern;
   a first metal electrode which penetrates a portion of the passivation layer disposed on the source area and a portion of the source region below the portion of the passivation layer to contact an exposed portion of the buffer layer and be electrically connected with the source region;
   a second metal electrode which penetrates a portion of the passivation layer disposed on the drain area and a portion of the drain region below the portion of the passivation layer to contact an exposed portion of the buffer layer and be electrically connected with the drain region;
   a passivation insulating layer which covers the substrate having the second metal electrode; and
   an organic light-emitting diode disposed on the substrate having the passivation insulating layer to be electrically connected with the drain region.

7. The flat panel display device of claim 6, further comprising, a third metal electrode which penetrates a portion of the passivation layer on the gate electrode to be electrically connected with the gate electrode pattern.

8. The flat panel display device of claim 7, wherein the first to third metal electrodes are formed of aluminum or an aluminum alloy.

9. The flat panel display device of claim 6, wherein the source and drain regions are formed to a thickness of about 10 nm to 50 nm, respectively.

* * * * *